United States Patent [19]
Atsumi

[11] Patent Number: 5,295,105
[45] Date of Patent: Mar. 15, 1994

[54] SEMICONDUCTOR MEMORY DEVICE

[75] Inventor: Shigeru Atsumi, Tokyo, Japan

[73] Assignee: Kabushiki Kaisha Toshiba, Tokyo, Japan

[21] Appl. No.: 764,633

[22] Filed: Sep. 24, 1991

[30] Foreign Application Priority Data

Sep. 28, 1990 [JP] Japan .................................. 2-259041

[51] Int. Cl.$^5$ ............................................. G11C 7/00
[52] U.S. Cl. .................................. 365/218; 365/185; 365/63
[58] Field of Search .............. 365/185, 104, 218, 900, 365/63

[56] References Cited
U.S. PATENT DOCUMENTS

4,949,309  8/1990  Rao ..................................... 365/218

Primary Examiner—Joseph A. Popek
Attorney, Agent, or Firm—Banner, Birch, McKie & Beckett

[57] ABSTRACT

This invention provides a semiconductor memory device comprising a plurality of memory cells having a common source diffused region extending in a specified direction, a word line that extends in parallel with the common source diffused region and is connected to each gate of the plurality of memory cells, a first source interconnection composed of a first metal interconnection layer electrically connected to the common source diffused region, and a second source interconnection that extends in parallel with the word line and is composed of a second metal interconnection layer electrically connected to the first source interconnection.

21 Claims, 11 Drawing Sheets

SEMICONDUCTOR MEMORY DEVICE

BACKGROUND OF THE INVENTION

1. Field of the Invention

This invention relates to a semiconductor memory device using transistors as memory cells, and more particularly to a semiconductor memory device employing with memory cells capable of erasing and rewriting data.

2. Description of the Related Art

In some of erasable programmable nonvolatile memory devices such as EPROMs, a basic memory cell is composed of a stacked-gate MOS transistor, where data is written by injection of hot electrons from the drain, while it is erased by applying high voltage to the source to cause tunnel current. Memory cells of this type are usually known as EPROM tunnel oxide memory cells (hereinafter, referred to as ETOX cells), whose cross section is shown in FIG. 1A.

Figure 1A:
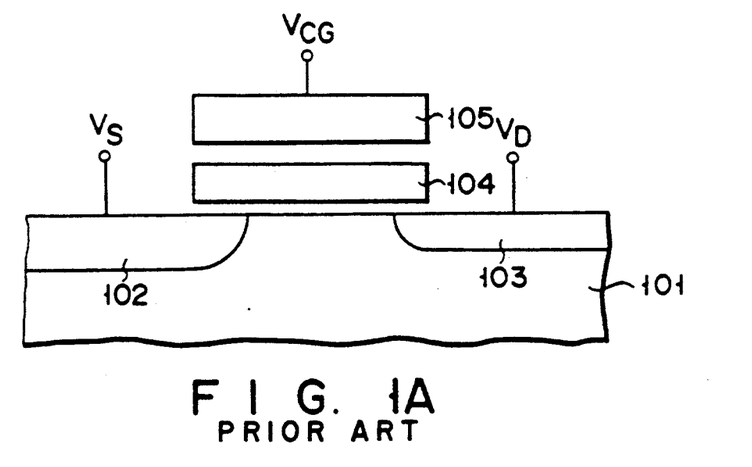
FIG. 1A is a sectional view of an EPROM-tunnel oxide memory cell.

In FIG. 1A, numeral 101 indicates a substrate, 102 a source, 103 a drain, 104 a floating gate, and 105 a control gate.

Figure 1B:
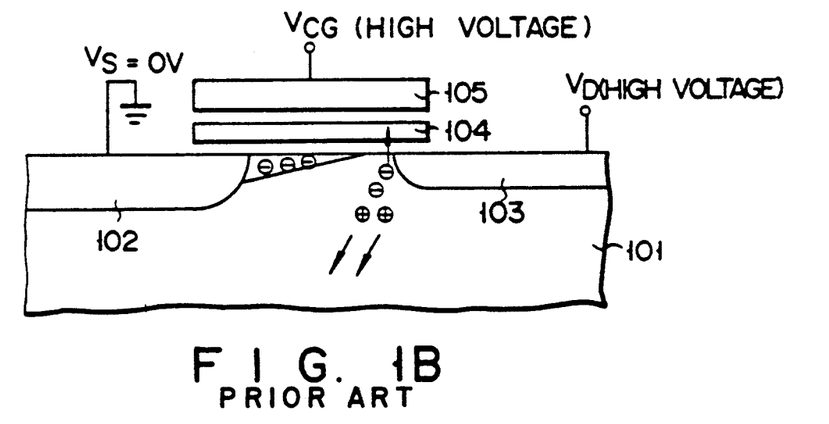
FIG. 1B is a sectional view illustrating how to write data into the memory cell of FIG. 1A.
Figure 1C:
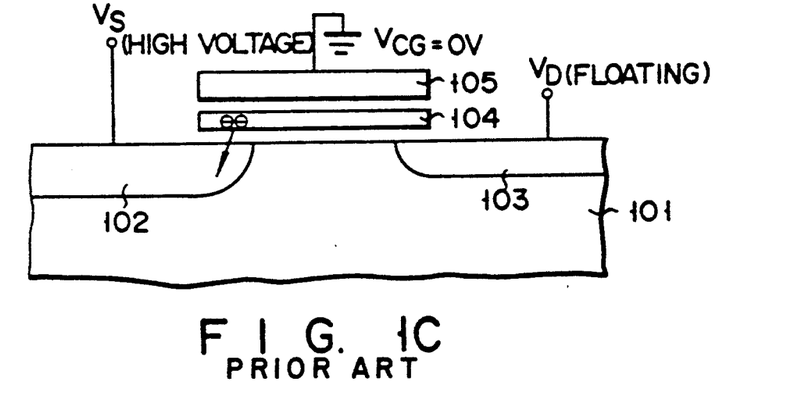
FIG. 1C is a sectional view illustrating how to erase data from the memory cell of FIG. 1A.

Data is written into an ETOX cell of such a structure in the same way as an ordinary EPROM cell. Specifically, as shown in FIG. 1B, a low voltage of, for example, 0 V as the source voltage $V_S$ is applied to the source 102; a high voltage as the drain voltage $V_D$ to the drain 103; and a high voltage as the control gate voltage $V_{CG}$ to the control gate 105. Under these voltage conditions, ON current flows between the source and drain, generating pairs of hot electrons and holes in the vicinity of the drain. The hot electrons are injected into the floating gate 104, which raises the threshold of the transistor, thereby completing the write operation. On the other hand, the holes flow into the substrate 101 as substrate current. The erasing of data is done by applying a high voltage to the source 102 and a low voltage of, for example, 0 V to the control gate 105, which sets the drain 103 to a floating state, as shown in FIG. 1C. The floating gate potential depends on the source voltage and the capacitance ratio of the capacitance between the control gate 105 and floating gate 104 and the capacitance between the floating gate 104 and source 102. With this floating gate potential, Fowler-Nordheim tunnel current flows between the floating gate 104 and source 102, which extracts electrons from the floating gate 104, thereby completing the erase operation.

In conventional EEPROMs Electrically Erasable Programmable ROMs) using the ETOXs, data is written on a bit basis, while it is erased on an all-bit basis (flush erasure). This is because in constructing a memory cell array through a conventional single-layer metal process, a significantly large size chip is required to erase data in small blocks, leading to unreasonably high cost.

Figure 2:
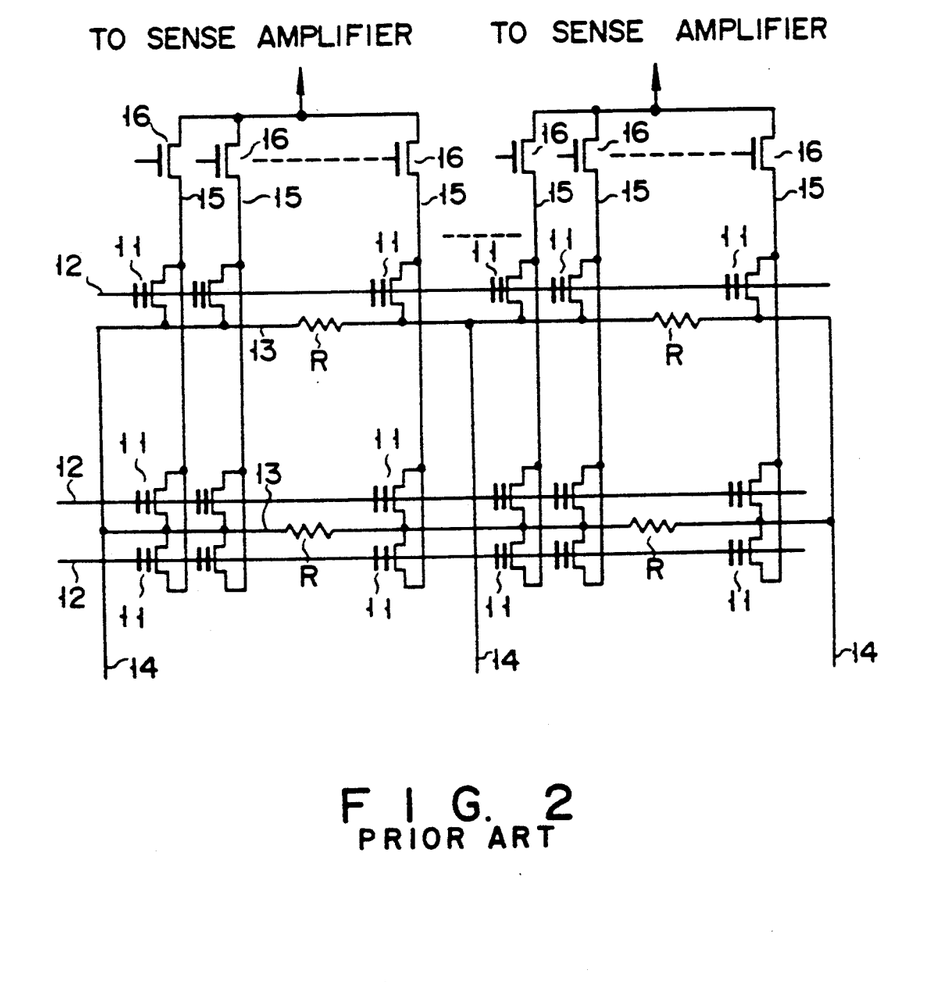
FIG. 2 is a circuit diagram for a memory cell array in a conventional EEPROM employing the memory cell of FIG. 1A.

FIG. 2 is a circuit diagram of a memory cell array section in a conventional EEPROM employing the FIG. 1A memory cell. In the figure, numeral 11, . . . , 11 indicate ETOX cells arranged in matrix, 12, . . . , 12 word lines connected to the gates of ETOX cells 11 on a row basis, 13, . . . , 13 common source diffused interconnections composed of diffused regions and connected to the sources of the ETOX cells 11 on a two adjacent row basis, 14, . . . , 14 source interconnections made of a metal such as aluminum electrically connecting the individual common source diffused interconnections 13 to one another, and 15, . . . , 15 bit lines made of a metal such as aluminum connected to the drains of the ETOX cells 11 on a column basis. The EEPROM is assumed to allow a plurality of bits to be read from or written into in parallel simultaneously. Therefore, the ETOX cells 11 are divided into groups of a specified number of parallel bits on a bit line basis, and the bit lines 15 are each connected to sense amplifiers via column select transistors 16.

Figure 3:
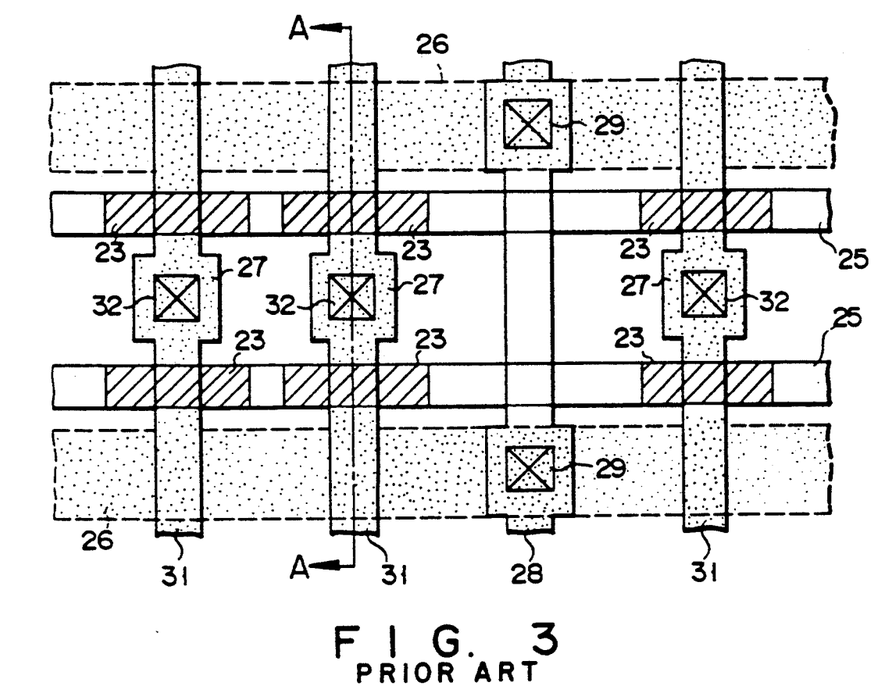
FIG. 3 is a pattern layout for the memory cell array of FIG. 2.
Figure 4:
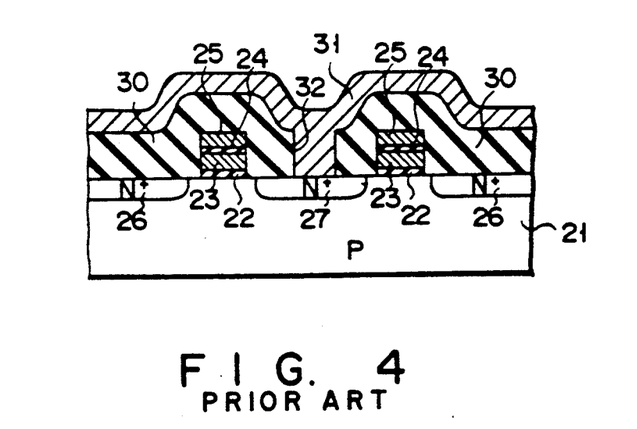
FIG. 4 is a sectional view taken along line A—Aa of FIG. 3.

FIG. 3 is a pattern layout for a integrated circuit of the memory cell array of FIG. 2. FIG. 4 is a sectional view through line A—$A_a$ of FIG. 3. In this example, a p-type silicon substrate 21 is used as semiconductor substrate, and the ETOX cells are of the n-channel type. In FIG. 4, numeral 22 indicates a first gate insulating film of an ETOX cell; 23 a floating gate; 24 a second gate insulating film; 25 a control gate composed of, for example, a layer of polysilicon, and constituting the word line 12; 26 an n+-type diffused region constituting the common source and the common source diffused interconnection 13; 27 an n+-type diffused region serving as the common drain of two adjacent ETOXs in the column direction; 28 a metal interconnection serving as the source interconnection 14 made of, for example, aluminum, and connected to the n+-type diffused region 26; 29 a contact hole connecting the metal interconnection 28 to the n+-type diffused region 26; 30 an interlayer insulating film covering the control gate; 31 a metal inter connection made of, for example, aluminum, serving as the bit line 15, and connected to the n+-type diffused region 27 serving as the common drain; and 32 a contact hole connecting the metal interconnection 31 to the n+-type diffused region 27.

With this arrangement, the drain potential of each ETO cell is normally applied via the aluminum bit line 15; the gate potential (control gate potential) is applied via the word line 12 extending in the direction crossing the bit line 15; and the source potential is applied via the common source diffused line 13 extending in the direction parallel with the word line 12. The resistance of the common source diffused interconnection 13 is higher than that of a metal interconnection such as aluminum, which has the same effect of inserting resistance R in the common source interconnection 13 as shown in FIG. 2. For this reason, source interconnections 14 of low-resistance aluminum are connected to the source diffused interconnection 13 at a suitable number of places in order to apply the source potential to the common source diffused interconnection 13 in a distributed manner.

With this EEPROM, write operation is based on the same principle as that explained in FIG. 1B with a high voltage selectively applied to one bit line 15 and one word line 12, and the ground potential to the common source diffused interconnection 13. Erase operation is based on the same principle as that explained in FIG. 1C by grounding all the word lines 12 and putting the column select transistor 16 in the off state to put all the bit lines 15 in a floating state while applying a high voltage to the common source diffused interconnection. That is, because of memory layout restrictions, all bits are erased simultaneously (flush erasure).

As noted above, with conventional EEPROMs using ETOX cells, layout restrictions merely permits all bits or a block of many bits to be erased at a time. To erase data in much smaller memory blocks, it is necessary to significantly increase the chip size. The reason for this will be explained below.

For example, in a flush-erase-type EEPROM of one megabits, the minimum unit will be considered for a case where the memory cells are divided into blocks, in which blocks data is erased. Ordinary 1-megabit memory arrays have a rectangular matrix of 1 kilo rows×1 kilo columns. A bit string to be written or read has a length of 8 bits or 16 bits like ordinary EPROMs. Since the sense amplifiers for data read are located on the column side, the memory cell array has a structure of 1 kilo rows×128 columns×8 bits or 1 kilo rows×64 columns×16 bits.

Now, consideration will be given to a case where the source potential previously applied to the common source diffused interconnection 13 shared by all bits is applied to the individual aluminum source interconnections 14 independently. Specifically, in FIG. 2, the common source diffused line 13 shared by the sources in the column direction is divided into blocks at intervals of, for example, eight bit lines, and each block is independently applied with the source potential. In this case, source interconnections 14 are provided at a rate of eight bit lines per source interconnection. If eight-bit strings are used, the minimum block unit will be as large as 1 kilo/1 column×8 column ×8 bits=64 kilobits. An attempt to divide memory cells into still smaller blocks requires more source interconnections 14, resulting in a larger chip size.

Users want data erasure in much smaller blocks. For example, in the field of magnetic disk memory devices, a single track is divided into 512-byte units and all operating systems (OS) are also based on 512-byte units. To apply flush-erase-type EEPROMs to this field, it is necessary to change such OS, which is technically difficult. Another problem with flush-erase-type EEPROMs is the time required to rewrite data. The time required to write one megabits of data is generally approximately 15 seconds, provided that the write time per bit is 100 μs. Thus, to rewrite only a small amount of data involves first erasing all bits and then writing the data spending 15 seconds, which would have an adverse effect on applications.

There is still another problem with EEPROMs: repetition of erase/write (E/W) cycles is limited. This is because repetition of erase/write operations permits charges to be trapped in the gate insulating film, aggravating the characteristics gradually. The characteristics of memory cells is normally guaranteed for as many as 10 4 times of E/W cycles. Therefore, it is desirable to erase data in smaller blocks. Erasure in smaller blocks prevents extra electrical stress from being applied to the memory cells not to be rewritten, which helps improve the overall reliability of the device.

SUMMARY OF THE INVENTION

Accordingly, the object of the present invention is to provide a semiconductor memory device capable of erasing data in smaller blocks without increasing the chip size in integration.

The foregoing object is accomplished by a semiconductor memory device comprising: a plurality of memory cells having a common source diffused region extending in a specified direction; a word line that contains at least one polysilicon layer connected to the gates of the plurality of memory cells and extends in parallel with the common source diffused region; a first source interconnection composed of a first metal interconnection layer electrically connected to the common source diffused region; and a second source interconnection that is composed of a second layer of a metal interconnection layer electrically connected to the first source interconnection and extends in parallel with the word line.

With this configuration, data in the memory cells is erased in blocks by connecting the second source interconnection to a suitable number of first source interconnections and selectively applying a voltage to a plurality of second source interconnections. Because the first source interconnection is composed of a different metal interconnection layer from that of the second source interconnection, it is possible to lay out the second source interconnection freely, which allows the erasing of data in smaller blocks without increasing chip size.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates presently preferred embodiments of the invention and, together with the general description given above and the detailed description of the preferred embodiments given below, serves to explain the principles of the invention.

DETAILED DESCRIPTION OF THE PREFERRED EMBODIMENTS

Referring to the accompanying drawings, the present invention will be explained through embodiments.

Figure 5:
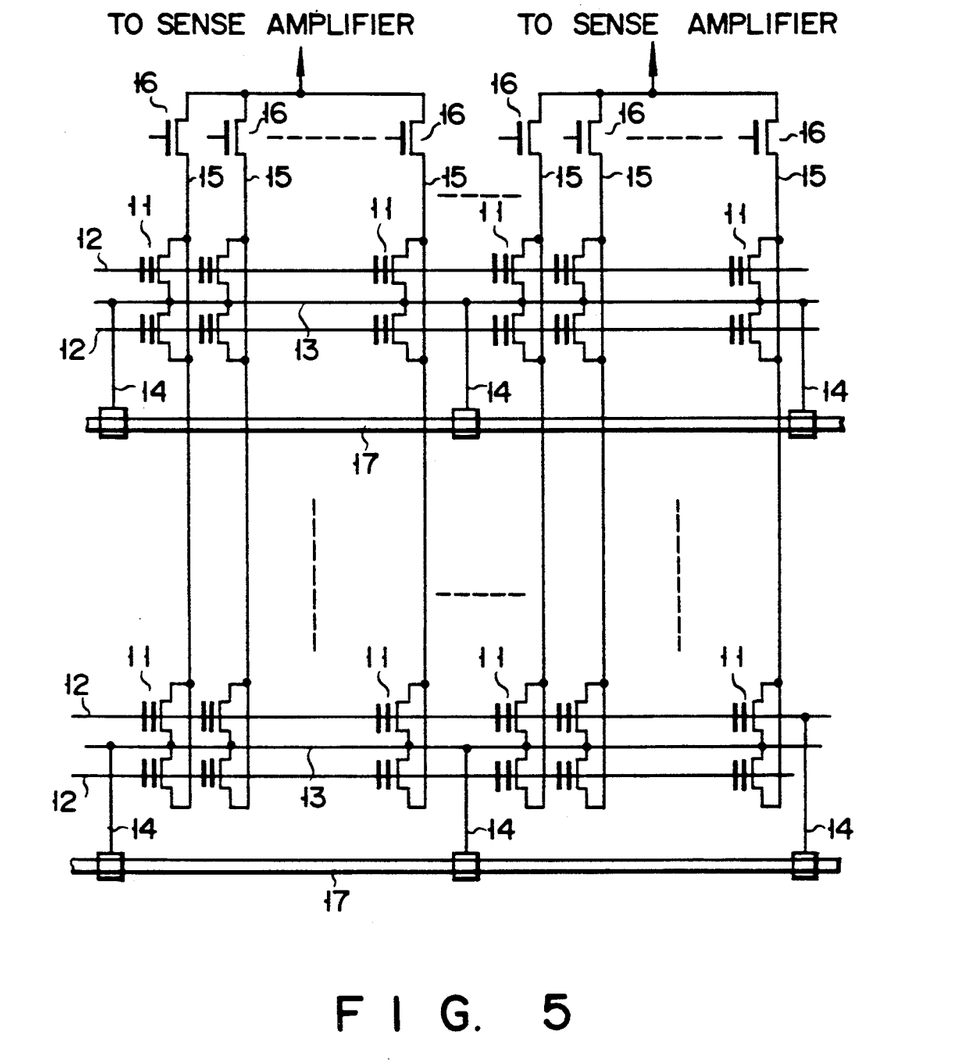
FIG. 5 is a circuit diagram for a memory cell array in a EEPROM employing a semiconductor memory device according to the present invention.

FIG. 5 is a circuit diagram for a memory cell array in an EEPROM according to an embodiment of the present invention. Parts corresponding to those in a conventional equivalent of FIG. 2 are indicated by the same reference characters. In FIG. 5, numerals 11, . . . , 11 each indicate ETOX cells, 12, . . . , 12 word lines at least one of whose layers is composed of, for example, only a polysilicon layer, a silicide layer, or a polycide layer and which are connected to and shared by the gates of ETOX cells 11 on a row basis, 13, . . . , 13 common source diffused interconnections connected to and shared by the sources of the ETOX cells 11 on a two adjacent row basis, 14, . . . , 14 first source interconnections made of a metal such as aluminum electrically connecting the individual common source diffused interconnections 13 to one another, and 15, . . . , 15 bit lines made of a metal such as aluminum connected to and shared by the drains of the ETOX cells 11 on a column basis. The EEPROM is assumed to allow a plurality of bits to be read or written in parallel simultaneously. The ETOX cells 11 are divided into groups of a specified number of parallel bits on a bit line basis, and the bit lines 15 are each connected to sense amplifiers via column select transistors 16. Numerals 17, . . . , 17 indicate second source interconnections that are composed of metal interconnections belonging to a layer different from that of the source interconnections 14, and electrically connected to the source interconnections 14 connected to the common source diffused interconnections 13.

Figure 6:
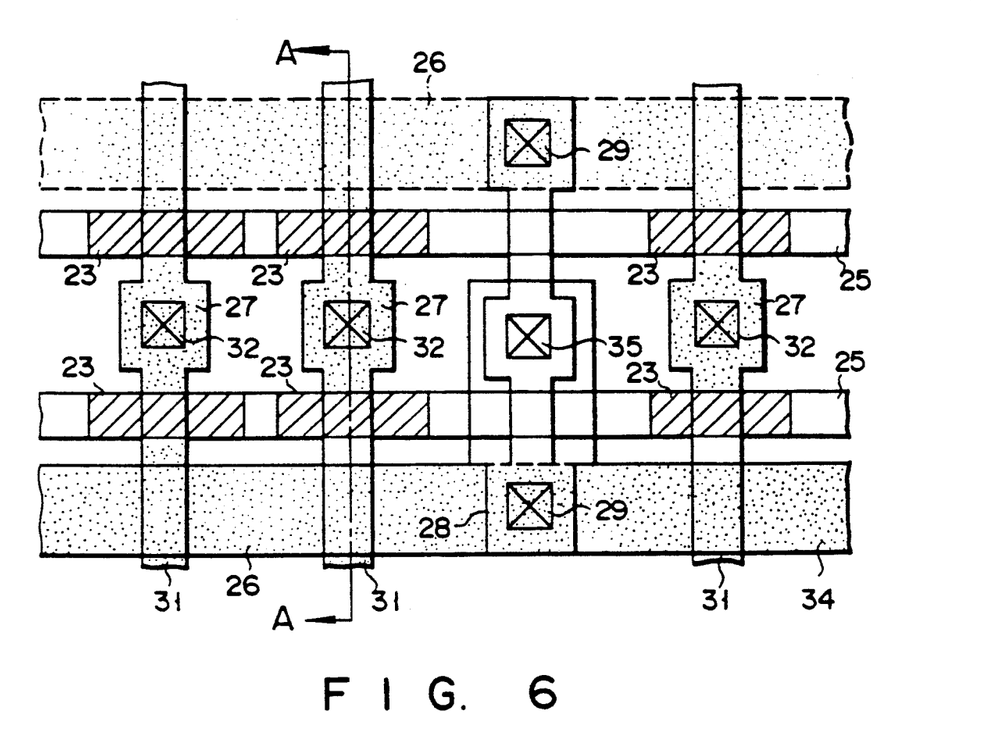
FIG. 6 is a pattern layout for the memory cell array of FIG. 5.
Figure 7:
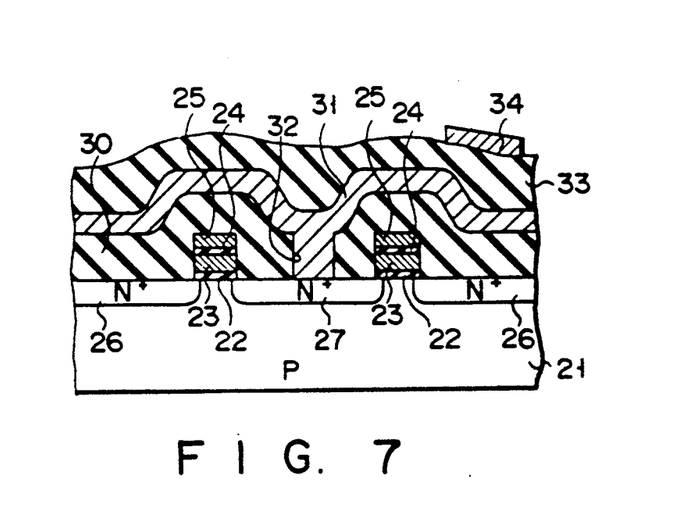
FIG. 7 is a sectional view taken along line A—Aa of FIG. 5.

FIG. 6 is a pattern layout for an integrated circuit of the memory cell array of FIG. 5. FIG. 7 is a sectional view taken along line A—A$_a$ of FIG. 6. Parts corresponding to those of the conventional equivalent in FIGS. 3 and 4 are indicated by the same reference characters. In FIGS. 6 and 7, numeral 21 indicates a p-type silicon substrate 21; 22 a first gate insulating film of an ETOX cell; 23 a floating gate; 24 a second gate insulating film; 25 a control gate composed of, for example, a layer of polysilicon, and constituting the word line 12; 26 an n$^+$-type diffused region constituting the common source and the common source diffused interconnection 13; 27 an n$^+$-type diffused region serving as the common drain of two adjacent ETOXs in the column direction; 28 a metal interconnection serving as the source interconnection 14 made of, for example, aluminum, and connected to the n$^+$-type diffused region 26; 29 a contact hole connecting the metal interconnection 28 to the n$^+$-type diffused region 26; 30 an interlayer insulating film covering the control gate; 31 a metal interconnection made of, for example, aluminum, serving as the bit line 15, and connected to the n$^+$-type diffused region 27 serving as the common drain; and 32 a contact hole connecting the metal interconnection 31 to the n$^+$-type diffused region 27.

On the metal interconnections 28 and 31, an interlayer insulating film 33 is formed, on which a metal interconnection 34 composed of a second aluminum layer constituting the second source interconnection 17 is formed. The metal interconnection 34 extends in the direction parallel with the extension of the word line so as to partially go beyond toward the n$^+$-type diffused region 27 to serve as the common drain as shown in FIG. 6. This protrusion is electrically connected to the metal interconnection 28 via the through hole 35.

In the embodiment, the memory cell array is divided into blocks for each second source interconnection 17, and each block has two rows of memory cells. Although two word lines share a single second source interconnection, in principle, it is possible to divide the memory cell array into blocks in the range of the number of word lines divided by 2. For example, a 1 megabits (1K×1K) memory cell array can be divided into blocks of 2 kilobits. This sufficiently meets the above-mentioned conditions for erasing data in blocks of 512 bytes (=4 kilobits).

An erase/write operation is now explained, referring to FIG. 5. In a write operation, a high voltage is applied to the word line 12 and bit line 15 of the selected memory cell. At this time, the 0-V ground potential is applied to the second source interconnection 17 connected to the common source diffused interconnection 13 within the block in which at least the selected memory cell exists. As a result, data is written into the particular memory cell as explained in FIG. 1B.

In an erase operation, the ground voltage is applied to all word lines 12 to set the bit lines 15 to a floating state, while a high voltage is selectively applied via the second source interconnection 17 and first source interconnection 14 to only the common source diffused interconnection 13 within the selected block. At this time, a low voltage or the 0-V ground voltage is applied, in parallel, to the common source diffused interconnections in the remaining blocks. This enables the erasing of the selected block only.

To achieve the above-describe erase operation in blocks, it is necessary to provide a decoder circuit that decodes the source potential to selectively apply the resulting potential to the proper common source diffused interconnection. Explanation will be given about the decoder circuit.

Since the decoder circuit applies a potential to the second source interconnection extending in parallel with the word line, it is desirable to position the decoder circuit next to or in the vicinity of the memory cell array. Because the source of the memory cell corresponding to the same row address as that of the word line is selected, the most efficient layout is such that the decoder circuit is positioned in the same place where the row decoder that selects word lines is located.

Various practical circuits of decoders (hereinafter, referred to as source decoders) will be explained which selectively supply a high or low voltage to the second source interconnection 17.

Figure 8:
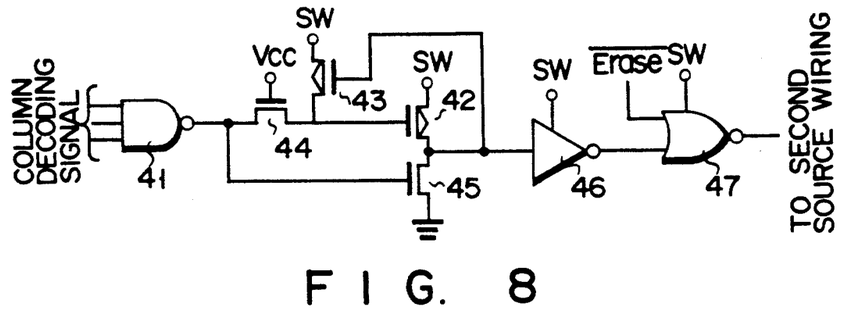
FIGS. 8 through 11 are circuit diagrams of different source decoders.

In the source decoder of FIG. 8, V$_{CC}$ is a supply voltage for data read of, for example, 5 V, and SW is an internal supply voltage, which is obtained from V$_{CC}$ inside the integrated circuit and during erase/write operations, is at a high voltage of, for example, 12 V, while during read operation, it is at 5 V. V$_{CC}$-system row decode signal is decoded at a NAND gate 41 and then converted into an SW-system voltage at a circuit composed of p-channel MOS transistors 42 and 43, n-channel MOS transistors 44 and 45, and an inverter 46. The converted signal, together with the erase-mode signal $\overline{\text{Erase}}$, is supplied to a NOR gate 47 that operates on the SW-system voltage. The erase-mode signal $\overline{\text{Erase}}$ is an SW-system signal, which is low (L) in an erase operation, and during other operations, high. The output of the NOR gate 47 is supplied to the corresponding second source interconnection. Thus, such source decoders are provided as many as the number of the second source interconnections, and the input of each NAND gate has a different combination of row decode signals.

During erase operation with the signal $\overline{\text{Erase}}$ low, if the logic at the NAND gate 41 in a source decoder holds and its output is low, then the transistor 42 will turn on and the input of the inverter 46 goes high. As a result, Both inputs to the NOR gate 47 go low, which causes the gate 47 to supply a 12-V-system supply voltage to the corresponding second source interconnection. In this case, the NAND gates 41 of the remaining source decoders fail to establish their logic, which makes the outputs high. These high outputs turn on the corresponding transistors 45, resulting in the low inputs to the inverters 46. This causes the NOR gate 47 to be low or the 0-V ground potential, which is supplied to all the remaining second source interconnections. Consequently, data is erased in blocks as mentioned earlier. The p-channel MOS transistor is provided for the purpose of putting the transistor 42 in a sufficiently off state by setting the gate potential of the p-channel MOS transistor 42 to the gate potential when the input of the inverter 46 is low or when the transistor 42 turns off and the transistor 45 turns on. The n-channel MOS transistor 44 with the gate applied with $V_{CC}$ is provided to prevent current leakage from SW to the output of the NAND gate 41 when the gate potential of the transistor 42 is set to SW.

In write/read operations, the signal $\overline{\text{Erase}}$ goes high, which causes the output of each NOR gate 47 to be the 0-V ground potential. Data is then read and written in the same manner as a conventional equivalent.

Figure 9:
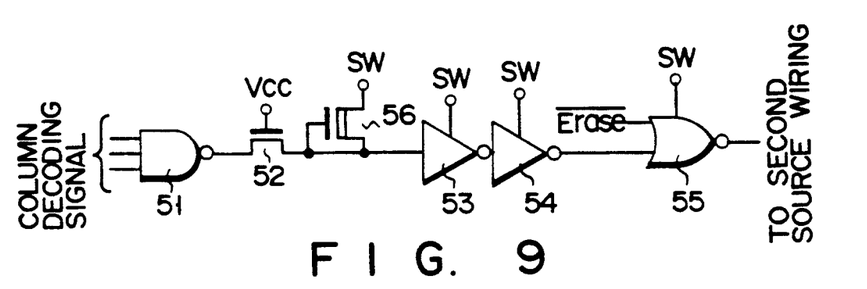

In the source decoder of FIG. 9, a $V_{CC}$-system row decode signal is decoded at a NAND gate 51 and supplied to an inverter 53, which operates on the Sw-system voltage, via an n-channel MOS transistor 52 with the gate applied with $V_{CC}$. The output of the inverter 53 is supplied to an inverter 54, which also operates on the SW-system voltage. The output of the inverter 54, together with the erase-mode signal $\overline{\text{Erase}}$, is supplied to a NOR gate 55 that operates on the SW voltage. The output of the NOR gate 55 is supplied to the corresponding second source interconnection. A depletion-mode MOS transistor 56 acting as an SW-system load is connected to the input of the inverter 53.

During an erase operation with the signal $\overline{\text{Erase}}$ low, if the logic at the NAND gate 51 in a source decoder holds and the output is low, then the output of the inverter 53 will be high and the output of the inverter 54 will be low. As a result, both inputs to the NOR gate 55 are low, which causes the gate 55 to supply a 12V-system supply voltage to the corresponding second source interconnection. In this case, the NAND gates 51 of the remaining source decoders fail to establish their logic, which makes the outputs high. As a result, the transistor 56 sets the input of the inverter 53 to an SW-system high level, which makes the output of the inverter 53 low. This low output makes the output of the inverter 54 high, which causes the output of the NOR gate 55 to be the 0-V ground potential. In write/read operations, the signal $\overline{\text{Erase}}$ goes high, which causes the output of each NOR gate 55 to be the 0-V ground potential as in FIG. 8. Data is then read and written in the same manner as a conventional equivalent.

Figure 10:
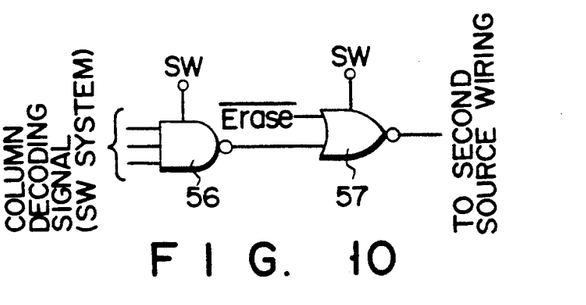

While in the source decoders in FIGS. 8 and 9, the row decode signal to the NAND gate 41 or 51 is a $V_{CC}$-system signal, it may be converted into an SW-system signal at the stage of the row decode signal. The source decoder of FIG. 10 is an example of using an SW-system row decode signal, in which case the SW-system row decode signal is decoded at a NAND gate 56 and then supplied, together with the SW-system erase-mode signal $\overline{\text{Erase}}$, to a NOR gate 57. L- During an erase operation with the signal $\overline{\text{Erase}}$ low, if the logic at the NAND gate 56 in a source decoder holds and its output is low, then the output of the NOR gate 57 will be at a high voltage of 12 V.

Figure 11:
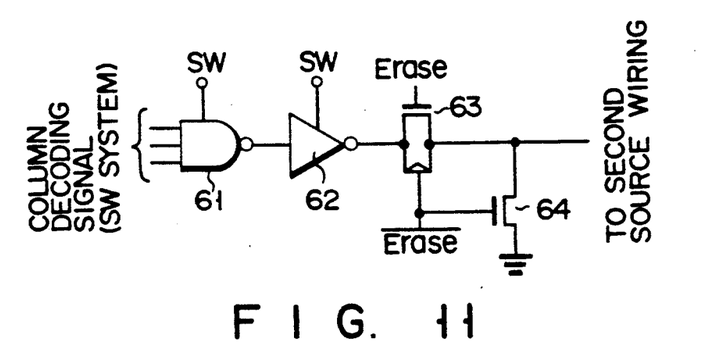

The source decoder of FIG. 11 is also an example of using an SW-system row decode signal. In this source decoder, the SW-system row decode signal is decoded at a NAND gate 61 and then inverted at an SW-system inverter 62. This signal passes through a CMOS transfer gate 63, which is composed of p-channel and n-channel MOS transistors and provides on-off control according to the erase-mode signal $\overline{\text{Erase}}$ and its inverted signal, to produce the output to the corresponding second source interconnection. Between the second source interconnection and the ground potential, an n-channel MOS transistor 64 is connected which is on during the time other than erase operation with the gate supplied with the erase-mode signal $\overline{\text{Erase}}$.

With this source decoder, in an erase operation with the signal $\overline{\text{Erase}}$ low and its inverted signal high, the CMOS transfer gate 63 is conductive, which makes the transistor 64 off. At this time, if the logic of the NAND gate holds and its output is low, then the output of the inverter 62 will be high. This signal is supplied to the second source interconnection via the CMOS transfer gate 63. On the other hand, the periods of time other than erase operation, the CMOS transfer gate 63 is non-conductive, which causes the transistor 64 to be on, thereby allowing the ground potential to be supplied to the second source interconnection.

In the above explanation, the layout of a single source decoder is used for clarity. Since the word line and second source interconnection are selected by the same address, it is desirable to position the row decoder and source decoder in the same place in terms of pattern design efficiency.

Figure 12:
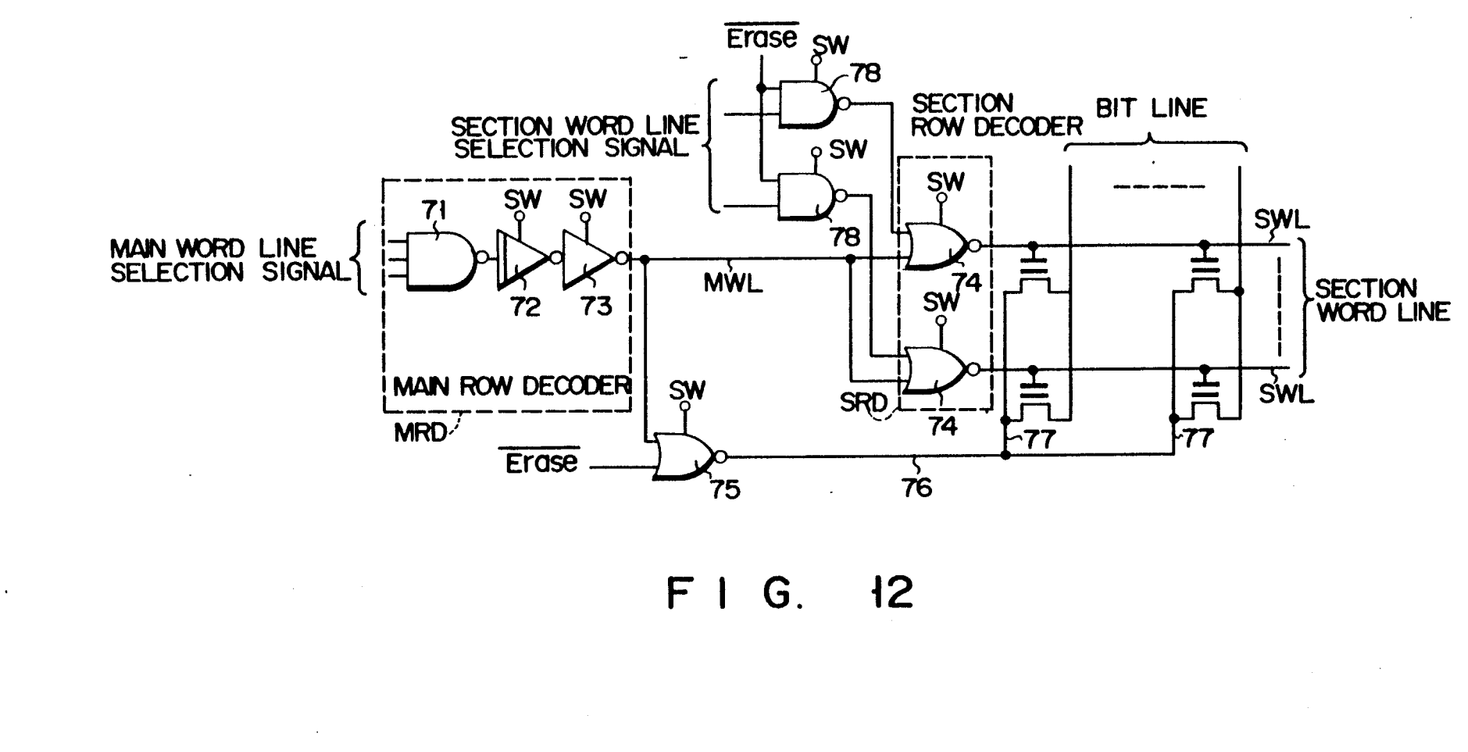
FIG. 12 is a circuit diagram for a semiconductor memory device according to the present invention along with a row decoder and a source decoder.

FIG. 12 is a circuit diagram of an entire semiconductor memory device, which contains a row decoder and a source decoder, according to the present invention. In this embodiment, the word line 12 is composed of a main word line MWL and section word lines SWL, and is based on the double word line system. That is, selection of these two word lines are made through two stages of the main row decoder and section row decoder.

In FIG. 12, the main word line select signal undergoes the decoding operation and voltage conversion at the main row decoder MRD, which is made up of a NAND gate 71 and two SW-system inverters 72 and 73, and then is supplied to the main word line MWL. The signal on the main word line MWL, together with the section word line select signal, is decoded at the section row decoder made up of NOR gates 74, . . . , 74, and then is supplied to the section word lines SWL. The signal on the main word line MWL, together with the erase-mode signal Erase, is also decoded at a NOR gate 75 serving as the source decoder and then is supplied to the second source interconnection 76. The signal on the second source interconnection 76 is supplied to the common source diffused interconnection within the block via each first source interconnection 77. The section word line select signal, together with the erase-mode signal $\overline{\text{Erase}}$, is supplied to the section row decoder SRD so that all section word lines SWL may be low when the erase-mode signal $\overline{\text{Erase}}$ is low (in erase operation).

Figure 13:
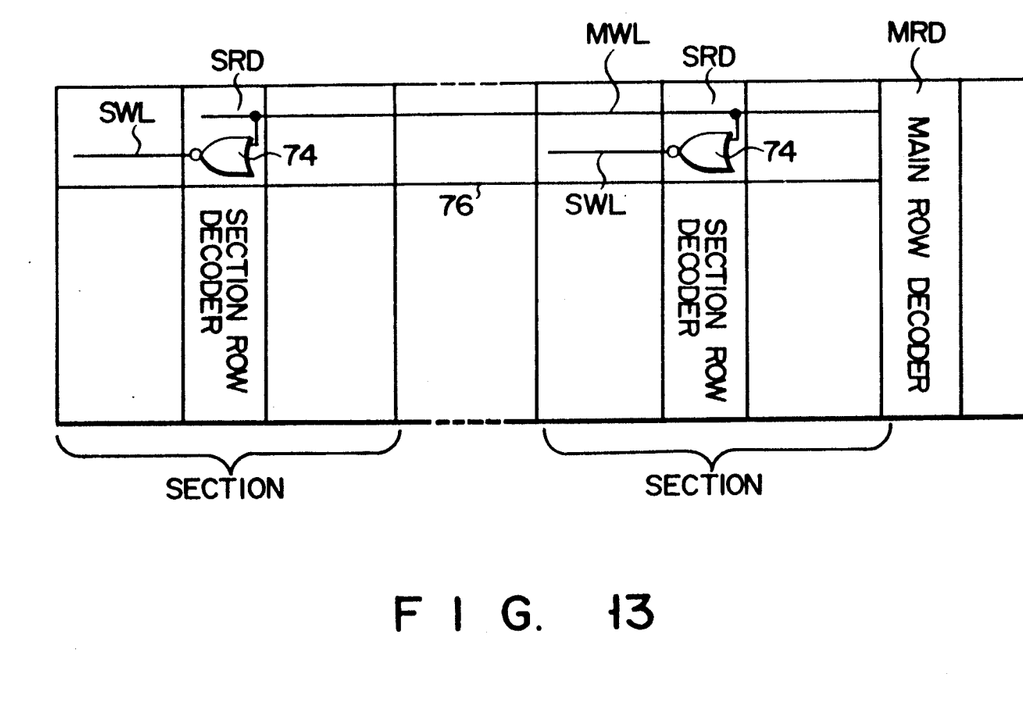
FIG. 13 is a pattern layout for the circuit of FIG. 12.

FIG. 13 is a pattern layout for the integrated circuit of FIG. 12. As shown in FIG. 13, the memory cells in the memory cell array are divided into sections, in each of which each memory cell shares the source diffused region. The output of the main row decoder MRD is supplied to each section via the main word line MWL. The section word lines SWL each receive signals via the NOR gates 74 in the section row decoder SRD. The signal to the second source interconnection 76 is supplied via the NOR gate 75 (not shown in FIG. 13) in the same circuit block where the main row decoder MRD exists.

In this embodiment, the main row decoder MRD also performs voltage conversion from $V_{CC}$-system to SW system, but other approaches may be possible. For example, if the signal to be decoded is already converted into an SW-system signal, the main row decoder of the arrangement shown in FIG. 10 may be used. While NOR gates are used in the section row decoder, AND gates may be used to construct a similar section row decoder.

In a semiconductor memory device using the decoder of FIG. 12, the memory cells controlled by the same main word line form each block, and data is erased in blocks. The signal decoded at the main row decoder is used as it is for a decoding operation on the source side, so that there is almost no increase in the area occupied by the decoder in comparison with a conventional equivalent with no signal decoding on the source side. In this case the main word line and second source interconnection are formed in the direction of the word line. The space between the main word line and second source interconnection might be insufficient because the section word line is usually composed of a polysilicon layer, while the main word line is made up of a metal interconnection at a different layer from that of the bit line, or of a metal interconnection at the second layer, the same as that of the second source interconnection. However, main word lines may be provided at a rate of a plurality of section word lines per main word line, for example, 4 or 6 lines per main word line, which allows sufficient spacing between the main word line and second source interconnection.

Figure 14:
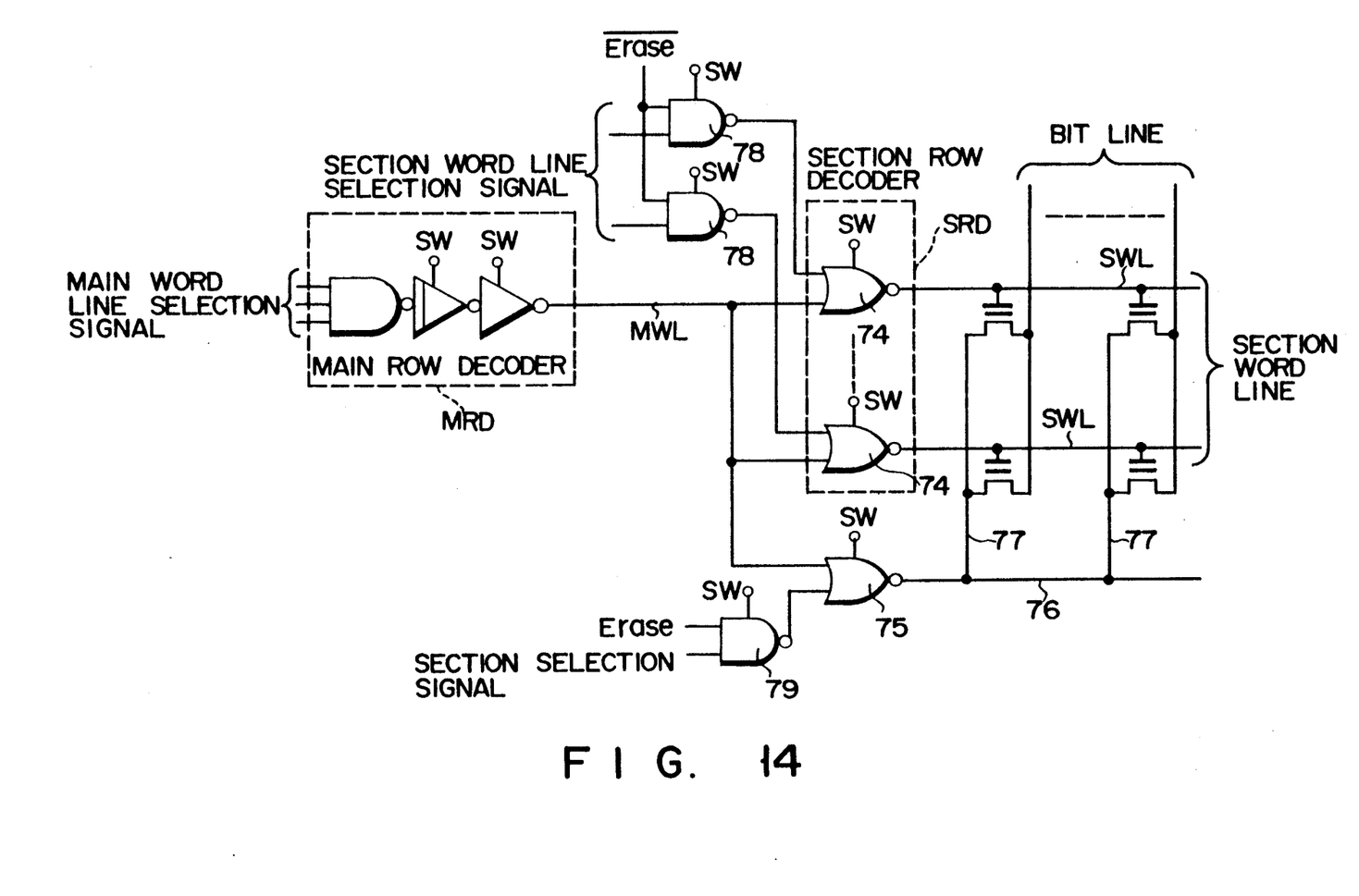
FIG. 14 is another circuit diagram for a semiconductor memory device according to the present invention along with a row decoder and a source decoder.

FIG. 14 is a circuit diagram of an entire semiconductor memory device different from that of FIG. 12, which contains a row decoder and a source decoder, according to the present invention. In the embodiment of FIG. 12, data is erased simultaneously by each main word line, but as the memory capacity increases, the number of memory cells per main word line increases accordingly. This creates the necessity to erase data in even smaller units. Therefore, in this embodiment, the memory cells sharing the same main word line are further divided into smaller groups by the section, and each second interconnection is also divided further. With this arrangement, instead of directly supplying the erase-mode signal $\overline{\text{Erase}}$ to the NOR gate 75 constituting the source decoder, the inverted signal of the erase-mode signal $\overline{\text{Erase}}$ is decoded using the second select signal. This decoded signal, together with the main word line MWL, is supplied to the NOR gate 75 acting as the source decoder, the output of which is in turn supplied to the second source interconnection 76 in the corresponding section.

Figure 15:
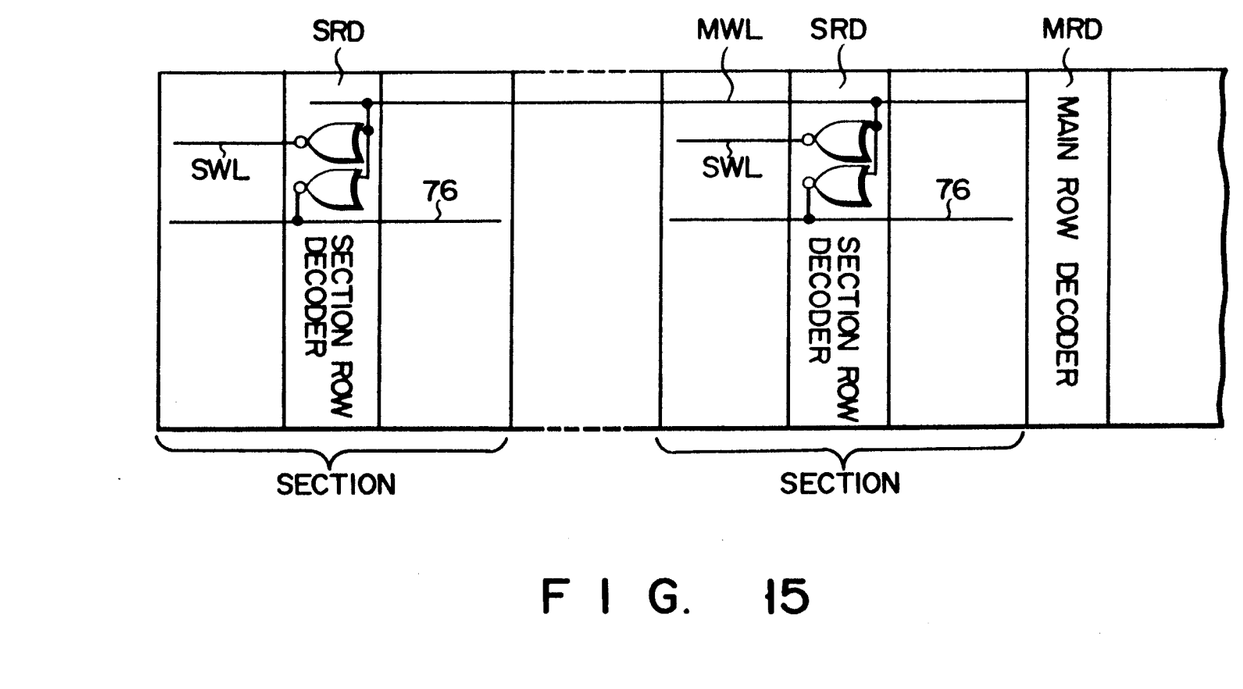
FIG. 15 is a pattern layout for the circuit of FIG. 14.

FIG. 15 is a pattern layout for the integrated circuit of FIG. 14. As shown in FIG. 15, the second source interconnection 76 is divided into sections. The signal decoded at the main row decoder MRD is supplied to the section row decoder SRD in each section via the main word line MWL. The section row decoder SRD further decodes the signal and supplies it to the section word lines SWL divided by the section. In the section row decoder SRD in each section, the signal on the source side is also decoded. The decoded signal is supplied to the common source diffused interconnection via the second source interconnection 76 in each section.

Figure 16:
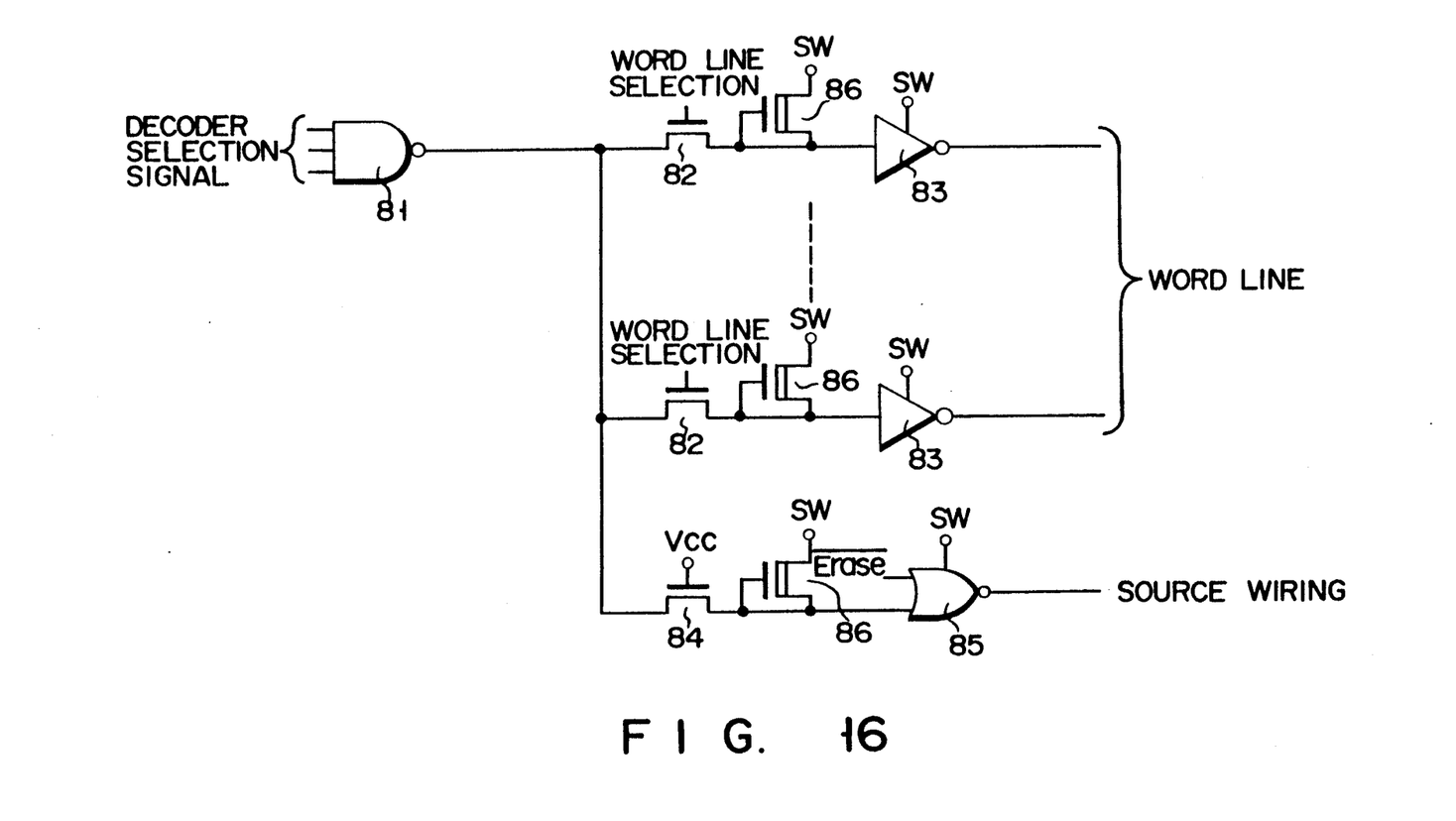
FIG. 16 is a circuit diagram for the decoder circuit section in another embodiment of the present invention.

This invention is not limited to the above-described embodiments and may be practiced or embodied in still other ways without departing from the spirit or essential character thereof. For example, while in the above embodiments, the present invention is applied to an EEPROM using ETOX cells, it may be applicable to ordinary EPROMs or EEPROMs. FIG. 16 is a circuit diagram of an ordinary semiconductor memory device such as EPROM or EEPROM to which the present invention is applied. Specifically, the output of the NAND gate 81, which receives the decoder select signal (such as a part of the row address signal), is supplied to each SW-system inverter 83 via each MOS transistor 82, whose gate receives the word line select signal (the signal obtained by decoding the rest of the row address signal). The output of each inverter 83 is supplied to the corresponding word line. The output of the $\overline{\text{NAND}}$ gate 81, together with the erase-mode signal $\overline{\text{Erase}}$, is supplied to an SW-system NOR gate 85 via a MOS transistor 84 whose gate receives the supply voltage $V_{CC}$. The output of the NOR gate 85 is supplied to the corresponding source interconnection. The memory cells are divided into sections and the source region of each memory cell shares a single source interconnection (second source interconnection) for each section. Depletion-mode MOS transistors 86 are connected to the input of each inverter 83 and to on input of the NOR gate 85 the other input of which is connected to the erase-mode signal.

This invention may be applied to other types of EPROMs and SRAMs (Static Random Access Memories) as well as EEPROMs using ETOX cells.

Although in the embodiments, data is erased independently in blocks, which are obtained by dividing the memory cells suitably, all memory cells may be erased simultaneously. That is, overall erase operation ca be achieved by specifying addresses so that all second source interconnections may be selected. By adding an overall erase function, it is possible to select either block erase mode or overall erase mode as required.

As described so far, it is possible to provide a semiconductor memory device capable of erasing data in smaller blocks without increasing the chip size in integration.

Additional advantages and modifications w 11 readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
 a plurality of memory cells having a common source diffused region extending in a specified direction;
 a word line that extends in parallel with said common source diffused region and is connected to each gate of said plurality of memory cells;

a first source interconnection composed of a first metal interconnection layer electrically connected to said common source diffused region; and a second source interconnection that extends in parallel with said word line and is composed of a second metal interconnection layer electrically connected to said first source interconnection.

2. A semiconductor memory device according to claim 1, wherein said first source interconnection extends in the direction crossing said word line.

3. A semiconductor memory device according to claim 1, wherein said second source interconnection is provided for each word line or for every specified number of adjacent word lines, and is independently supplied with a different potential according to the input address.

4. A semiconductor memory device according to claim 1, wherein said memory cell is a nonvolatile memory cell capable of erasing and rewriting data.

5. A semiconductor memory device comprising:
a memory cell array having a plurality of memory cells arranged in row and column matrix, wherein data may be rewritten to or erased from said memory cells, each row of memory cells has a common source diffused region extending in a specified direction, and at least one common source diffused region has a higher voltage applied thereto during an erase operation than the other common source diffused regions;

a plurality of word lines, each of which extends in parallel with one of said common source diffused regions and is connected to and shared by the gates of said plurality of memory cells in a row of the array;

first decoding means for selecting one of said plurality of word lines according to an input address applied to said first decoding means;

a plurality of first source interconnections composed of a first metal layer electrically connected to said common source diffused regions;

a plurality of second source interconnections composed of a second metal interconnection layer electrically connected to said first source interconnections, wherein each of said second source interconnections extends in parallel with at least one of said word lines; and second decoding means for selectively applying a high voltage to one of said plurality of second source interconnection corresponding to the input address and for selectively applying a low voltage to the remaining second source interconnection in an erase operation.

6. A semiconductor memory device according to claim 5, wherein said plurality of first source interconnections extend in the direction crossing said word line.

7. A semiconductor memory device according to claim 5, wherein said second decoding means is supplied with a first control signal for controlling the erase mode, as well as said input address.

8. A semiconductor memory device according to claim 5, wherein said second decoding means is positioned next to said memory cell array.

9. A semiconductor memory device according to claim 5, wherein said word line is composed of a main word line (MWL) and a plurality of section word lines (SWL), and said second decoding means is supplied with the signal on said main word line (MWL) as said input address.

10. A semiconductor memory device according to claim 5, wherein said memory cell array is divided into a plurality of sections in the direction of said word line, with each section being provided with said second source interconnection.

11. A semiconductor memory device according to claim 5, wherein in an erase operation, a high voltage is applied either to only some of said second source interconnections selectively or to all second source interconnections in parallel.

12. A semiconductor memory device according to claim 5, wherein in an erase operation, said second decoding means applies a high voltage either to one of said second source interconnections selectively, corresponding to the input address, or to all second source interconnections in parallel.

13. A semiconductor memory device comprising:
a plurality of memory cell transistors having drain regions, a common source region, and floating gate regions, each said floating gate region overlying a channel region between said common source region and said drain regions;

a word line extending in a first direction and overlying said floating gate regions;

a first interlayer insulating film overlying said word line;

a first metal source interconnection layer extending in a second direction and coupled to said common source region through first contact holes in said first interlayer insulating film;

metal bit lines extending substantially parallel to each other in the second direction, each said metal bit line coupled to at least one of said drain regions through second contact holes in said first interlayer insulating film;

a second interlayer insulating film overlying said metal bit lines and said first metal source interconnection layer; and a second metal source interconnection layer extending in the first direction and coupled to said first metal source interconnection layer through a contact hole in said second interlayer insulating film.

14. A semiconductor memory device according to claim 13, wherein the first direction and the second direction are substantially perpendicular.

15. A semiconductor memory device comprising:
memory cell transistors arranged in a matrix having rows and columns, wherein said memory cell transistors in a predetermined number of rows of the matrix share a common source region;

word lines respectively coupled to control gates of said memory cell transistors in each row of the matrix;

metal bit lines respectively coupled to drain regions of said memory cell transistors in each column of the matrix;

first metal source interconnections, each being coupled to one of said common source regions; and second metal source interconnections coupled to said first metal source interconnections and extending in the direction of the rows of the matrix.

16. A semiconductor memory device according to claim 15, wherein a predetermined number of first metal source interconnections are coupled to each common source region.

17. A semiconductor memory device according to claim 16, wherein the predetermined number of first metal source interconnections are separated by a predetermined number of memory cell transistors.

18. A semiconductor memory device according to claim 16, wherein each of said second metal source interconnections corresponds to one of said common source regions.

19. A semiconductor memory device according to claim 18, wherein each second metal source interconnection is coupled to the predetermined number of first metal source interconnections of its corresponding common source region.

20. A semiconductor memory device according to claim 19, wherein said first metal source interconnections constitute a different layer than said second metal source interconnections.

21. A semiconductor memory device according to claim 15, wherein said first metal source interconnections constitute a different layer than said second metal source interconnections.

* * * * *